US008515561B2

(12) United States Patent  (10) Patent No.: US 8,515,561 B2
Tang et al.  (45) Date of Patent:  Aug. 20, 2013

(54) CONTROL AND PROTECTION SYSTEM OF CONVERTER VALVE OPERATION TEST EQUIPMENT

(76) Inventors: Guangfu Tang, Beijing (CN); Xingang Zhang, Beijing (CN); Kunpeng Zha, Beijing (CN); Zheng Lv, Beijing (CN); Zhiyuan He, Beijing (CN)

( * ) Notice: Subject to any disclaimer, the term of this patent is extended or adjusted under 35 U.S.C. 154(b) by 720 days.

(21) Appl. No.: 12/679,304

(22) PCT Filed: Dec. 24, 2009

(86) PCT No.: PCT/CN2009/001550
§ 371 (c)(1),
(2), (4) Date: Mar. 19, 2010

(87) PCT Pub. No.: WO2011/075875
PCT Pub. Date: Jun. 30, 2011

(65) Prior Publication Data
US 2011/0276189 A1    Nov. 10, 2011

(30) Foreign Application Priority Data
Dec. 23, 2009 (CN) ............... 2009 1 0243012

(51) Int. Cl.
G05B 11/01 (2006.01)
G05D 9/00 (2006.01)
G05D 7/00 (2006.01)
G05D 11/00 (2006.01)
(52) U.S. Cl.
USPC .......... 700/19; 700/11; 700/15; 700/17; 700/281; 700/282; 700/286; 700/287; 340/539.1; 340/539.17; 340/540; 340/531; 340/521

(58) Field of Classification Search
None
See application file for complete search history.

(56) References Cited

U.S. PATENT DOCUMENTS

| 6,550,057 B1 * | 4/2003 | Bowman-Amuah ......... 717/126 |
| 8,013,732 B2 * | 9/2011 | Petite et al. ................ 340/539.1 |
| 2009/0234508 A1 * | 9/2009 | Kallfass et al. ............... 700/282 |
| 2010/0057263 A1 * | 3/2010 | Tutunoglu ..................... 700/282 |

* cited by examiner

Primary Examiner — Kavita Padmanabhan
Assistant Examiner — Sunray R Chang
(74) Attorney, Agent, or Firm — Yi Chen

(57) ABSTRACT

This present provides a control and protection equipment system suitable for synthesis converter operation test, relates to power system automation equipment field. This system includes human-machine interface element, synchronization element, signal acquisition element, data aggregation element, conditioning element, protecting element, wave form recording element, wave form monitor element, on-off input element, on-off output element, vale based element (VBE), high direct current supply power system controller, high voltage supply system controller, current surge circuit controller, impulse circuit controller, test converter valve water cooling controller and test equipment water cooling system controller. This system can control converter samples and auxiliary valves on set trigging timing, produce various operation tests need heat, voltage and current of the converter samples and carry through operation tests. This system can also monitor on-off condition and important analog parameters condition of main circuit immediately, when abnormal condition takes place, the suitable protective measures will be made immediately.

12 Claims, 4 Drawing Sheets

CONTROL AND PROTECTION SYSTEM OF CONVERTER VALVE OPERATION TEST EQUIPMENT

RELATED APPLICATIONS

This Application is a United States National Stage Application filed under 35 U.S.C. §371 of PCT Patent Application Serial No. PCT/CN2009/001550 filed on Dec. 24, 2009, which claims the benefit of Chinese Patent Application Serial No. 200910243012.6 filed on Dec. 23, 2009, the disclosures of all of which are hereby incorporated by reference in their entirety.

FIELD OF THE INVENTION

The present invention relates to power system automation equipment, and relates particularly to a control and protection system of synthesis converter valve operation test.

BACKGROUND OF THE INVENTION

High voltage direct current transmission converter valve test equipment is used to test converter valve under worst operation condition and fault condition. It is a necessary equipment to accomplish converter valve type test. Converter valve is made up of many thyristor valves series or parallel connection. Now the voltage and current tolerance of converter valve are increasing with the increasing tolerance of thyristor valve. It requires much higher to the operation test equipment. To reduce the capacity of equipment, the international community usually adopts synthesis method to carry out operation test. Its basic principle is: the high voltage, high direct current, current surge and voltage surge are imposed on converter valve sample one by one through high voltage small current circuit, direct small voltage high current circuit, current surge circuit and impulse circuit respectively and by interval.

The main circuit of synthesis type converter valve operation test equipment includes converter valve sample, auxiliary valve, isolator, breaker, water cooling system, reactor, capacitor and transducer etc. To carry out each operation tests and minimize the damage of the abnormal condition, one complete function and good performance control and protection system. Chinese patent CN100392419C presented a synthesis all condition test equipment control and protection system and method. The system included top control and protect system, synthesis all condition test equipment measure system, electric charging circuit control and protection system, first water cooling device control and protection system, synthesis all condition test circuit control and protection system, second water cooling device control and protection system, small voltage high current control and protection, console and oscillograph; it included five independent subsystem, designed eight protection against different faults and nine priority according to fault severity condition. But this present invention is different from that invention in substance.

(1) Different usage. The invention CN100392419C control and protection system is used to control small voltage charging circuit, synthesis all condition test circuit and small voltage high current source, in fact it is designed for the flexible alternating current transmission thyristor valve operation test. But this present invention said control and protection system is used to control high voltage power system, high direct current power system, high voltage circuit, high direct current circuit, current surge circuit and impulse circuit to accomplish IEC60700(GB/T20990) defined all HVDC converter valves whole operation tests.

(2) Different control function. The invention CN100392419C control and protection system trigged test circuit and thyristor valve only according to fixed timing. Once each thyristor valve unlocked, the trigging number and phase are all fixed during each test period. But in this invention trigging time of each converter valve can change at times, even after the converter is unlocked the trigging number and phase can change according to different requirement. This will avoid abnormal faults because of trigging timing.

(3) Different protection function. The invention CN100392419C designed eight protection measures according to different faults, nine propriety according to different severity. This made this system the protection logic complicate and reduced reliability. On base of abnormal condition deep analysis, our invention separates all abnormal condition into three ranks: common abnormal, hazardous abnormal, emergency abnormal. The invention makes different measures separately: decoupling exit strategy, locking exit strategy and continuous trigging exit strategy according to different rank. This simplifies the protection function and system, improves the reliability of system.

(4) Different local controller. The invention CN100392419C third layer control and protection subsystem includes: electricity charging control and protection subsystem, first water cooling equipment control and protection subsystem, synthesis all condition test circuit control and protection subsystem, second water cooling equipment control and protection subsystem and small voltage high current source control and protection subsystem. This present invention said local controller includes: high direct current supply power controller, high voltage supply power controller, current surge circuit controller, impulse circuit controller, thyrisitor water system controller and test equipment water controller because of different function from invention CN100392419C. Except that the protected objects of two water cooling system controller is similar to the patent CN100392419C, our invention are all different from it.

(5) Different level structure. The patent CN100392419C control and protection adopted level structure and separated three levels clearly. Third level control and protection subsystem had not relation with "console" and "oscillograph" clearly. This invention adopts function element elements connection structure; there is no level structure concept. Various local controllers are connected with console directly through "long-distance CAN bus". This makes operators much faster communicate information with local controller.

(6) Patent CN100392419C had not presented detail methods of top layer control and protection system, synthesis all condition test equipment measure system. This invention provides control and protection detail function distribution and working timing. This point is original.

SUMMARY OF THE INVENTION

To achieve above aim, the synthesis converter valve operation test equipment carry out can achieve various operation tests and minimize the damage of the abnormal condition, one complete function and good performance control and protection system is needed.

This present invention provides a control and protection system of converter operation test equipment includes human-machine interface element, synchronization element, signal acquisition element, data aggregation element, conditioning element, protecting element, wave form recording element, wave form monitor element, on-off input element, on-off output element, vale based element (VBE), high direct current supply power system controller, high voltage supply system controller, current surge circuit controller, impulse circuit controller, test converter valve water cooling controller and test equipment water cooling system controller; above elements process data and logical judgment in certain timing order, said each element communicates information with each other through electric signal, optical fiber signal and by "deploy", "interface", "recording wave" and "long distance" four independent CAN buses; as a result, the test converter valve and auxiliary valve can be orderly trigged according to set timing order; various required voltage, current and heat for the test converter valves can be produced to carry out the operation test; at the same time this system can also immediate monitor test equipment main circuit on-off condition and important simulation parameters, when operation is abnormal, protective measures can be made actively and timely.

Said timing of various elements processing data and judging logic on set order is described as below:

(1) Synchronization element produces test needed "trigging synchronization" signal and "signal acquisition" signal according to test equipment high voltage supply power system or high current power system 50 Hz alternating source; "trigging synchronization" signal is used for synchronizing whole test equipment working, therefore one test period is one "trigging synchronization" signal period; "signal acquisition" signal is used for synchronizing signal acquisition element and data aggregation element;

(2) Signal acquisition element receives main circuit various sensors input simulation signals, trigs inner digital-analog converter according to "signal acquisition" signal which is sent from synchronization element, transform the simulation signals into digital signal and sends to data aggregation element;

(3) Data aggregation element keeps pace with signal acquisition element by "signal acquisition" signal, process signals which are sent by signal acquisition element such as elimination temperature drift, digital filter, calibrated signal and so on, at last sends the "acquisition results" to conditioning element, protecting element and wave form recording element;

(4) Conditioning element controls the present test process according to the "acquisition results" sent by data aggregation element, on-off information sent by on-off input element and VBE element, and control information sent by human-machine interface element through "deploy CAN bus", changes each converter valve trigging timing, sends the timing signal to on-off input; when the converter valve trigging timing is changed, conditioning element will send recording wave command to wave form recording element through "interface CAN bus" to effectively monitor the working condition of main circuit;

(5) Protecting element judges the test equipment abnormal or not from "acquisition results" sent by data aggregation element, on-off information sent by on-off input element and VBE element, and protection parameters sent by human-machine interface element through "deploy CAN bus"; if abnormal exits, it will make protective measures and send on-off action command to on-off output element through "interface CAN bus"; when abnormal occurs, protecting element send recording wave command to wave form recording element through "interface CAN bus" to effectively monitor the protection condition of main circuit;

(6) Wave form recording element processes "acquisition results" sent by data aggregation element and on-off information sent by on-off input element and VBE element, starts the record process according to conditioning element and protecting element commands, and sends record wave data to wave form monitor element though "recording wave CAN bus";

(7) On-off input element acquires various on-off information of the main circuit, sends to conditioning element, protecting element and wave form recording element through "interface CAN bus", sends to human-machine interface element through "deploy CAN bus", at the same time sends "trigging timing" signal produced by conditioning element to corresponding VBE element and high direct current supply power controller;

(8) On-off output element performs on-off action commands sent by protecting element through "interface CAN bus";

(9) In test circuit each converter corresponds a VBE element, each VBE element confirms trigging number and phase of the converter during each trigging period according to the "trigging timing" sent by conditioning element, sends trigging impulse to converter valves through optical fiber, at the same time monitors the working condition of each converter valve; once abnormal condition takes place, VBE element reports related information to conditioning element and protecting element through "interface CAN bus";

(10) High direct current supply power system controller, high voltage supply system controller, current surge circuit controller, impulse circuit controller, test converter valve water cooling controller and test equipment water cooling system controller receive the commands from "long distance CAN bus" sent by human-machine interface element, respectively controls corresponding main devices, at the same time monitors corresponding main devices and sent monitored information to human-interface element through "long distance CAN bus".

wherein said human-interface element includes one high performance IPC, communicates bi-direction with other elements through "deploy CAN bus" and "long distance CAN bus", its function contains: receiving operator sent various test parameters and commands and transmitting to other relate elements, polling the "deploy CAN bus" function elements and the local controller of "long distance CAN bus", acquiring test equipment main circuit monitor information through various elements and displaying on the monitor display of the element for the operator query.

wherein said synchronization element produces "signal acquisition synchronization" and "trigging synchronization" signal according to "alternating synchronization voltage" of test equipment main circuit; "alternating synchronization voltage" is alternating voltage that test equipment gained through high voltage supply power system or high current supply power system access point, is 50 Hz alternating voltage; synchronization element conditions and shapes "alternating synchronization voltage", produces "trigging synchronization" signal to provide each converter valve trigging time reference, and locks phase and multiplies frequency of the "trigging synchronization" signal, forms "acquisition synchronization" signal to start signal acquisition element and data aggregation element.

wherein said signal acquisition element is used to convert various physical quantity analog signal into digital signal in test equipment main circuit; to monitor test equipment operation condition, there are voltage sensors and current sensors on the important bypass circuits of the test equipment main circuit, there are temperature sensors, pressure sensors and flow sensors on the cooling system, signal acquisition element receives above analog signal of sensors, and carries out once digital analog conversion on each "signal acquisition synchronization" impulse signal arrival, converts these analog signal into digital signal, at last sends converted digital signal to data aggregation element.

wherein said data aggregation element processes signal acquisition element report signals, transmits process results to conditioning element, protecting element and wave form recording element; process working includes eliminating acquired signal temperature drift, calibrating variable bit rate, digital filter and converting coded format etc.

wherein said conditioning element receives the set test programs, work model and condition constant etc parameters of human-machine interface element through "deploy" CAN bus, acquisition result sent from data aggregation element, and confirms trigging timing of each converter valve, accomplishes trigging timing simultaneous switching coupled with vale based elements (VBE), decides whether allows each valve based elements VBE to check corresponding converters or not; under abnormal condition this element will also receive protecting commands of protecting element through "interface" CAN bus to aid protecting element achieve test equipment protection work.

wherein said protecting element receives the acquisition results sent from data aggregation element, monitor information from each VBE elements and on-off information from on-off input element; once the abnormal condition takes place, said protecting element will make suitable measures to protect test equipment safe;

To simplify the protecting element, the strategies of all abnormal conditions are separated into three ranks: common abnormal, hazardous abnormal and emergency abnormal, makes three different measures separately: decoupling exit strategy, locking exit strategy and continuous trigging exit strategy according to different rank.

wherein said wave form recording element receives on-off information from on-off input element and the acquisition results sent from data aggregation element during transient operation and sends to wave form monitor element; under steady condition, wave form recording element will immediate report the acquisition results of analog quantities to update test wave form immediately through wave form monitor element;

Said on-off input element is used to acquire various on-off quantity status information of isolator, breaker and test equipment main circuit, and report the result to human-interface element, conditioning element, protecting element and wave form recording element, and on-off input element is used as the inner signal main way of control and protection system, converts "trigging signal" from conditioning element into multi-way signal and distributes VBE elements;

Said on-off output element receives "interface" CAN bus commands from protecting element, and sends "on-off" signals to isolator, breaker and other on-off devices in test equipment main circuit according to "interface" CAN bus commands to drive these devices accomplish the set operations;

Said wave form monitor element contains one high performance IPC; During transient process, wave form monitor element receives analog signals, on-off parameter information reported by wave form recording element, and stores in the hard disk in data package form to inquire and display in the future; on the steady condition, it receives continuously steady wave form recording data reported by wave form recording element and updates the results immediately.

wherein said each auxiliary converter and converter sample have a valve based electric element VBE in the test equipment main circuit; on normal condition, each VBE trigs corresponding valves according to the "trigging timing" signal sent by conditioning element and "trigging synchronism" signal sent by synchronization element; if conditioning element admits converter monitor, VBE will receive various converter monitor information, and when abnormal condition takes place, protective measures will be made rapidly to protect monitor converters; on abnormal condition, each VBE element responds to the protecting element commands and locks valves or trigs valves continuously.

Wherein said the system uses independent local controllers, these controllers control high voltage supply system, high direct supply system, current surge circuit, impulse circuit, water cooling system of test equipment and converter sample according to operators commands, and monitors these equipments.

Wherein said conditioning element of the control and protecting system fans out signals through DI elements, sends "trigging timing" commands to each VBE element in order to trig corresponding converters of VBE elements on set trigging order; these trigging timing is the trig number and trig phase of converters in each test period or "trigging synchronization" signal period;

because VBE element uses uniform "trigging timing" commands, the trigging timing of each valves can be changed at the same time, and avoids abnormal condition due to different trigging timing.

Wherein said various elements communicates most data information through "deploy", "interface", "recording wave" and "long distance" four independent CAN buses, the structure and function of four buses are described as below:

The deploy CAN bus is "single master and more minor" form, master injection is human-machine interface element, minor injections include conditioning element, data aggregation element, protecting element, wave form recording element, on-off input element, on-off output element and various VBE elements; deploy CAN bus is used to transmit various human-machine interface information; operators input test parameters through human-machine interface element, these parameters are sent to corresponding function elements through this bus; on the other hand, the analog parameters, on-off parameters information, valve information and various inner events collected by control and protection system is returned to human-machine interface element through this bus for operators query;

Interface CAN bus is "more master and more minor" form, it is used to exchange information collected by VBE element and on-off information collected by on-off input element are sent to conditioning element, protecting element and wave form recording element; on the other hand, the conditioning element and protecting element also send action commands to VBE element and on-off output element through interface CAN bus;

Recording wave CAN bus is "one master and one minor" form, the master injection is monitor element, the minor injection is wave form recording element; wave recording CAN bus is used to transmit the wave form information of on-off parameters and analog parameters; wave form recording receives on-off information collected by on-off input element and analog parameter acquired results collected by signal acquisition element, and reports wave form monitor element then displays immediately through wave form monitor element;

Long distance CAN bus is "single master and more minor" form, master injection is human-machine interface element, the minor injection include high direct current supply system controller, high voltage supply system controller, current surge circuit controller, impulse circuit controller, sample valve water cooling system controller and test equipment water cooling controller; long distance CAN bus reports equipment monitor information collected by various local controllers.

The advantages of this present invention are described as below:

1. This system can from various test voltage, current and heat by controlling high voltage small current circuit, direct current small voltage high current circuit, surge circuit, impulse circuit and water cooling system to carry out through IEC60700 (GB209090) required direct current transmission converter operation test program;

2. This trigging timing can change at all times in conditioning element coupled with VBE element by the control and protection system. That means the trig number and phase of converters can be changed in wave period according to different requirements, further more, the change of all converters trigging timing can carry out at the same time. This avoids abnormal condition because of trigging timing change;

3. Although test equipment will meet various abnormal conditions, the protection strategy can be simplified as common abnormal, hazardous abnormal and emergency abnormal three ranks; this makes the protection strategy simple, reliable and easy to operate;

4. The frame structure of the control and protection system and function elements divisions are first brought into converter operation test;

5. This control and protection system has been applied on the converter operation test equipment. Its operation feasibility and reliability have been well proved;

6. This control and protection system is fully functional, the controlling, protecting and monitoring are all set in the one system.

7. It can be applied at wide range not only the converter operation test equipments but also other large scale electricity equipments;

8. Different from traditional protecting system, it cancels level layer concept, compacts the structure, and reduces the hardware investment costs.

BRIEF DESCRIPTION OF THE DRAWINGS

Currently preferred embodiments of the invention will now be described with reference to the following attached drawings in which.

DETAIL ED DESCRIPTION OF EMBODIMENTS

The detail of the embodiments is described as below incorporated with the figures by way of cross-reference.

Figure 1:
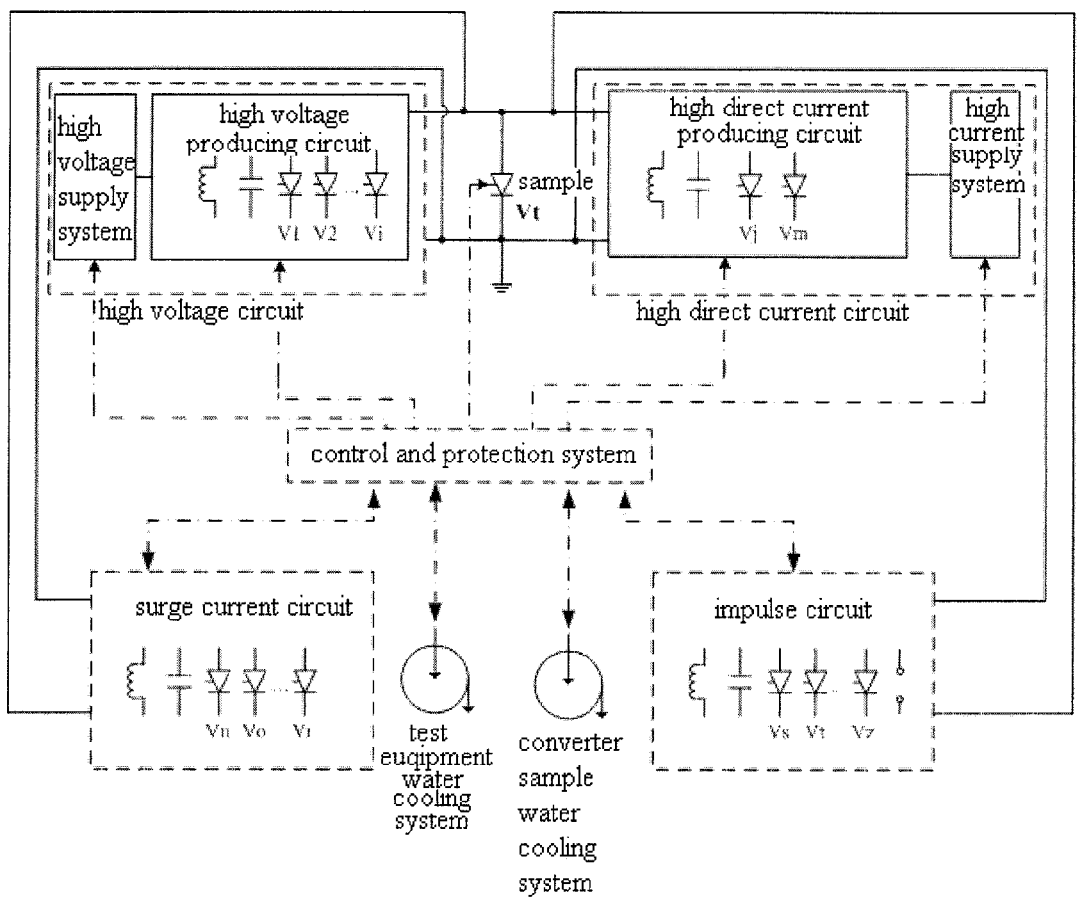
FIG. 1 is a working principle schematic diagram of this present synthesis converter valve operation test equipment.

The working principle schematic diagram of this present synthesis converter valve operation test equipment is shown in FIG. 1. The main device of test equipment includes high voltage circuit, high direct current circuit, surge current circuit, impulse circuit, test equipment water cooling system and converter sample water cooling system. High voltage circuit includes high voltage supply system and high voltage producing circuit, is used to provide high voltage, the maximum value of the voltage is up to 80 kV. High direct current circuit includes high current supply system and high current producing circuit, is used to provide test need steady current for the converter sample; the maximum value of the current is up to 6.2 kA. Surge current circuit is used to provide transient high current for converter sample, the peak value of current can be up to 55 kA. Impulse circuit is used to provide impulse voltage for test converter sample, the peak value of the voltage can be up to 300 kV. Two cooling system are respectively used to cool the test equipment and converter samples. This control and protection system produces IEC60700 (GB20990) required voltage, current and heat according to operator setting test program and parameters by controlling auxiliary valves, converter samples and other devices of the main circuit. This system also monitors analog parameters and on-off condition of the monitor circuit. Once abnormal takes place, suitable protective measures will be made rapidly.

Figure 2:
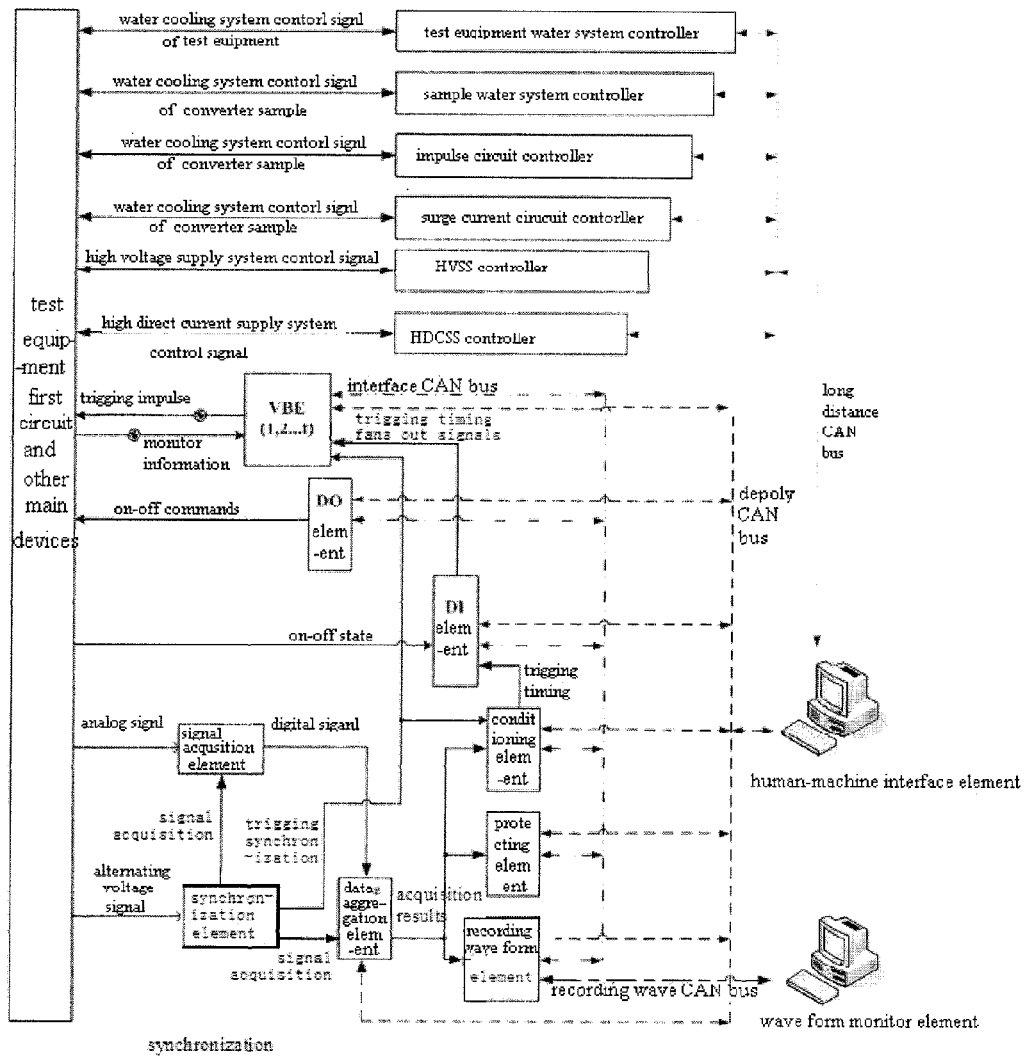
FIG. 2 is principle diagram of this present control and protection system.

The principle diagram of this present control and protection system is shown in FIG. 2.

The whole protection system includes: human-machine interface element, synchronization element, signal acquisition element, data aggregation element, conditioning element, protecting element, wave form recording element, wave form monitor element, on-off input element, on-off output element, vale based element (VBE), high direct current supply power system controller, high voltage supply system controller, current surge circuit controller, impulse circuit controller, test converter valve water cooling controller and test equipment water cooling system controller etc many function elements.

Synchronization element based on 50 Hz working frequency alternating voltage signal produces "trigging synchronism" and "signal acquisition synchronism" signal; "signal acquisition synchronism" is sent to data aggregation element and signal acquisition element, the two elements work synchronism; "trigging synchronism" signal is sent to conditioning element and VBE element to convert trigging timing of auxiliary valves and converter samples of main circuit. Signal acquisition element converts the analog signal into "digital signal" and then sent to data aggregation element, the data aggregation element eliminates temperature drift, digital filter, calibrates variable bit rate etc processes, and then sends these "acquired results" to conditioning element, protecting element and wave form recording element. DI element collects various on-off state parameters of main equipment, sends to conditioning element, protecting element and wave form recording element through "interface CAN bus", and sends to human-machine interface element through "deploy CAN bus. Conditioning element decides the trigging timing according to "acquisition results", on-off state and operators' commands and sends to DI element, the DI element fans out signals to each VBE. VBE trigs valves on trigging timing to monitor the corresponding valves.

Elements exchange information through four CAN buses. The injection of "deploy CAN bus" is human-machine interface element, the minor injections include conditioning element, data aggregation element, protecting element, wave form recording element, on-off input element DI, on-off output element DO and various VBE elements. The injections of interface CAN bus include: conditioning element, protecting element, wave form recording element, on-off input element DI, on-off output element DO and various VBE elements. The injections of recording wave CAN bus monitor element and wave form recording element. The injections of long distance CAN bus include: human-machine interface element, high direct current supply system controller, high voltage supply system controller, current surge circuit controller, impulse circuit controller, sample valve water cooling system controller and test equipment water cooling controller.

The following is the "maximum steady operation load test" and "maximum transient load test" example which is required by the IEC60700 (GB20990).

Figure 3:
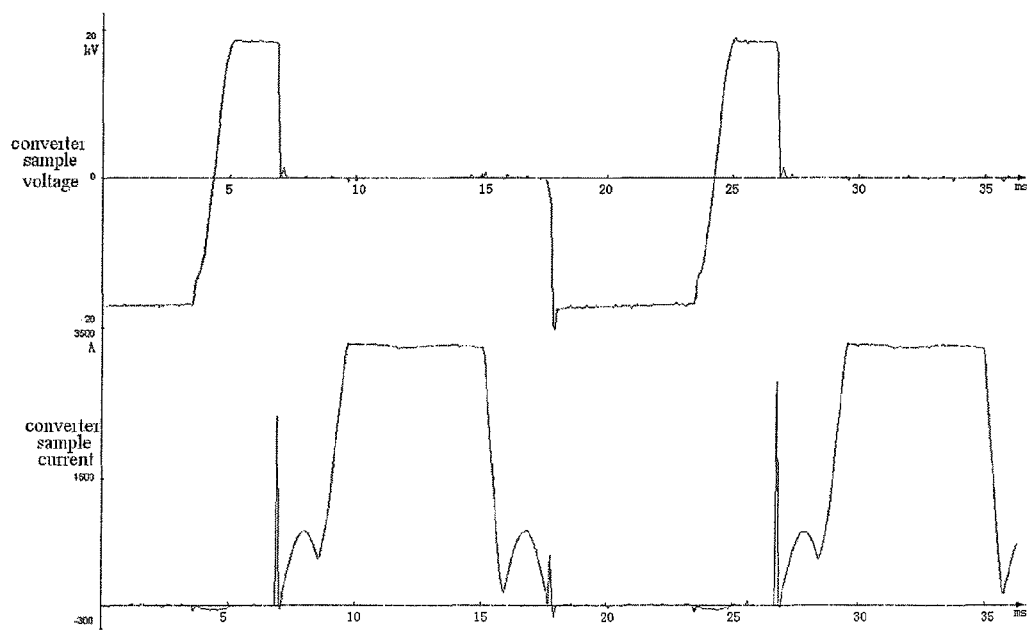
FIG. 3 is test wave form schematic diagram of this present maximum load steady operation test.

The "maximum steady operation load test" is used to examine converter sample whether meets the requirements under the worst operation conditions. The parameters of the test mainly include: positive trigging voltage, negative recovering voltage, equivalent current calculated to 120° conduction interval and voltage step squares of converter samples. This example test parameters are listed as below:

Positive trigging voltage: 18.1 kV
Negative recovering voltage: 17.5 kV
Equivalent current calculated to 120° conduction interval: 3612A
Voltage step squares: 633.86 $kV^2$
The test wave form is shown in FIG. 3.

In FIG. 3, the top half is converter sample voltage wave form; its y-axis stands for voltage value, its unit is kilo amperage (kA). The x-axis stands for time; its unit is microsecond (ms). The below half is current wave form, y-axis stands for current value, its unit is amperage (A), x-axis stands for time value, its unit is microsecond (ms).

Figure 4:
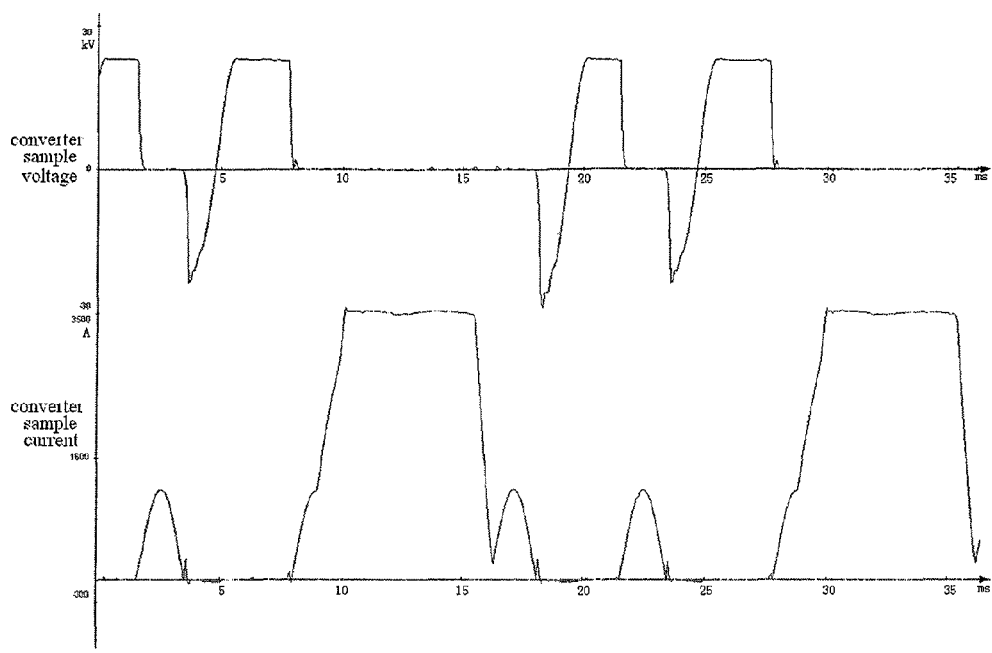
FIG. 4 is test wave form schematic diagram of this present maximum load transient operation test.

The "maximum transient load test" is used to exam whether the converter samples meet the requirements under the worst transient operation conditions. The test parameters are same to that of "maximum steady operation load test". This example parameters are listed as below:

Positive trigging voltage: 23.7 kV
Negative recovering voltage: 24.6 kV
Equivalent current calculated to 120° conduction interval: 3608A
Voltage step squares: 2333.7 $kV^2$
The test wave form is shown in FIG. 4.

In FIG. 4, the top half is converter sample voltage wave form; its y-axis stands for voltage value, its unit is kilo amperage (kA). The x-axis stands for time; its unit is microsecond (ms). The below half is current wave form, y-axis stands for current value, its unit is amperage (A), x-axis stands for time value, its unit is microsecond (ms).

At last, in this description of the embodiments, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

The invention claimed is:

1. A control and protection system of converter operation test equipment includes human-machine interface element, synchronization element, signal acquisition element, data aggregation element, conditioning element, protecting element, wave form recording element, wave form monitor element, on-off input element, on-off output element, vale based element (VBE), high direct current supply power system controller, high voltage supply system controller, current surge circuit controller, impulse circuit controller, test converter valve water cooling controller and test equipment water cooling system controller; above elements process data and logical judgment in certain timing order, said each element communicates information with each other through electric signal, optical fiber signal and by "deploy", "interface", "recording wave" and "long distance" four independent CAN buses; as a result, the test converter valve and auxiliary valve can be orderly triggered according to set timing order; various required voltage, current and heat for the test converter valves can be produced to carry out the operation test; at the same time this system can also immediate monitor test equipment main circuit on-off condition and important simulation parameters, when operation is abnormal, protective measures can be made actively and timely, said timing of various elements processing data and judging logic on set order is described as below:

(1) synchronization element produces test needed "trigging synchronization" signal and "signal acquisition" signal according to test equipment high voltage supply power system or high current power system 50 Hz alternating source; "trigging synchronization" signal is used for synchronizing whole test equipment working, therefore one test period is one "trigging synchronization" signal period; "signal acquisition" signal is used for synchronizing signal acquisition element and data aggregation element;

(2) signal acquisition element receives main circuit various sensors input simulation signals, trigs inner digital-analog converter according to "signal acquisition" signal which is sent from synchronization element, transform the simulation signals into digital signal and sends to data aggregation element;

(3) data aggregation element keeps pace with signal acquisition element by "signal acquisition" signal, process signals which are sent by signal acquisition element such as elimination temperature drift, digital filter, calibrated signal and so on, at last sends the "acquisition results" to conditioning element, protecting element and wave form recording element;

(4) conditioning element controls the present test process according to the "acquisition results" sent by data aggregation element, on-off information sent by on-off input element and VBE element, and control information sent by human-machine interface element through "deploy CAN bus", changes each converter valve trigging timing, sends the timing signal to on-off input; when the converter valve trigging timing is changed, conditioning element will send recording wave command to wave form recording element through "interface CAN bus" to effectively monitor the working condition of main circuit;

(5) protecting element judges the test equipment abnormal or not from "acquisition results" sent by data aggregation element, on-off information sent by on-off input element and VBE element, and protection parameters sent by human-machine interface element through "deploy CAN bus"; if abnormal exits, it will make protective measures and send on-off action command to on-off output element through "interface CAN bus"; when abnormal occurs, protecting element send recording wave command to wave form recording element through "interface CAN bus" to effectively monitor the protection condition of main circuit;

(6) wave form recording element processes "acquisition results" sent by data aggregation element and on-off information sent by on-off input element and VBE element, starts the record process according to conditioning element and protecting element commands, and sends record wave data to wave form monitor element though "recording wave CAN bus";

(7) on-off input element acquires various on-off information of the main circuit, sends to conditioning element, protecting element and wave form recording element through "interface CAN bus", sends to human-machine interface element through "deploy CAN bus", at the same time sends "trigging timing" signal produced by conditioning element to corresponding VBE element and high direct current supply power controller;

(8) on-off output element performs on-off action commands sent by protecting element through "interface CAN bus";

(9) in test circuit each converter corresponds a VBE element, each VBE element confirms trigging number and phase of the converter during each trigging period according to the "trigging timing" sent by conditioning element, sends trigging impulse to converter valves through optical fiber, at the same time monitors the working condition of each converter valve; once abnormal condition takes place, VBE element reports related information to conditioning element and protecting element through "interface CAN bus";

(10) high direct current supply power system controller, high voltage supply system controller, current surge circuit controller, impulse circuit controller, test converter valve water cooling controller and test equipment water cooling system controller receive the commands from "long distance CAN bus" sent by human-machine interface element, respectively controls corresponding main devices, at the same time monitors corresponding main devices and sent monitored information to human-interface element through "long distance CAN bus".

2. A control and protection system of converter operation test equipment according to claim 1, wherein:
said human-interface element includes one high performance IPC, communicates bi-direction with other elements through "deploy CAN bus" and "long distance CAN bus", its function contains: receiving operator sent various test parameters and commands and transmitting to other relate elements, polling the "deploy CAN bus" function elements and the local controller of "long distance CAN bus", acquiring test equipment main circuit monitor information through various elements and displaying on the monitor display of the element for the operator query.

3. A control and protection system of converter operation test equipment according to claim 2, wherein:
said synchronization element produces "signal acquisition synchronization" and "trigging synchronization" signal according to "alternating synchronization voltage" of test equipment main circuit; "alternating synchronization voltage" is alternating voltage that test equipment gained through high voltage supply power system or high current supply power system access point, is 50 Hz alternating voltage; synchronization element conditions and shapes "alternating synchronization voltage", produces "trigging synchronization" signal to provide each converter valve trigging time reference, and locks phase and multiplies frequency of the "trigging synchronization" signal, forms "acquisition synchronization" signal to start signal acquisition element and data aggregation element.

4. A control and protection system of converter operation test equipment according to claim 3, wherein:
said signal acquisition element is used to convert various physical quantity analog signal into digital signal in test equipment main circuit; to monitor test equipment operation condition, there are voltage sensors and current sensors on the important bypass circuits of the test equipment main circuit, there are temperature sensors, pressure sensors and flow sensors on the cooling system; signal acquisition element receives above analog signal of sensors, and carries out once digital analog conversion on each "signal acquisition synchronization" impulse signal arrival, converts these analog signal into digital signal, at last sends converted digital signal to data aggregation element.

5. A control and protection system of converter operation test equipment according to claim 4, wherein:
said data aggregation element processes signal acquisition element report signals, transmits process results to conditioning element, protecting element and wave form recording element; process working includes eliminating acquired signal temperature drift, calibrating variable bit rate, digital filter and converting coded format etc.

6. A control and protection system of converter operation test equipment according to claim 5, wherein:
said conditioning element receives the set test programs, work model and condition constant etc parameters of human-machine interface element through "deploy" CAN bus, acquisition result sent from data aggregation element, and confirms trigging timing of each converter valve, accomplishes trigging timing simultaneous switching coupled with vale based elements (VBE), decides whether allows each valve based elements VBE to check corresponding converters or not; under abnormal condition this element will also receive protecting commands of protecting element through "interface" CAN bus to aid protecting element achieve test equipment protection work.

7. A control and protection system of converter operation test equipment according to claim 6, wherein:
said protecting element receives the acquisition results sent from data aggregation element, monitor information from each VBE elements and on-off information from on-off input element; once the abnormal condition takes place, said protecting element will make suitable measures to protect test equipment safe;
to simplify the protecting element, the strategies of all abnormal conditions are separated into three ranks: common abnormal, hazardous abnormal and emergency abnormal, makes three different measures separately: decoupling exit strategy, locking exit strategy and continuous trigging exit strategy according to different rank.

8. A control and protection system of converter operation test equipment according to claim 7, wherein:
said wave form recording element receives on-off information from on-off input element and the acquisition results sent from data aggregation element during transient operation and sends to wave form monitor element; under steady condition, wave form recording element will immediate report the acquisition results of analog quantities to update test wave form immediately through wave form monitor element;
said on-off input element is used to acquire various on-off quantity status information of isolator, breaker and test equipment main circuit, and report the result to human-interface element, conditioning element, protecting element and wave form recording element, and on-off input element is used as the inner signal main way of control and protection system, converts "trigging signal" from conditioning element into multi-way signal and distributes VBE elements;
said on-off output element receives "interface" CAN bus commands from protecting element, and sends "on-off" signals to isolator, breaker and other on-off devices in test equipment main circuit according to "interface" CAN bus commands to drive these devices accomplish the set operations;

said wave form monitor element contains one high performance IPC; During transient process, wave form monitor element receives analog signals, on-off parameter information reported by wave form recording element, and stores in the hard disk in data package form to inquire and display in the future; on the steady condition, it receives continuously steady wave form recording data reported by wave form recording element and updates the results immediately.

9. A control and protection system of converter operation test equipment according to claim 8, wherein:

said each auxiliary converter and converter sample have a valve based electric element VBE in the test equipment main circuit; on normal condition, each VBE trigs corresponding valves according to the "trigging timing" signal sent by conditioning element and "trigging synchronism" signal sent by synchronization element; if conditioning element admits converter monitor, VBE will receive various converter monitor information, and when abnormal condition takes place, protective measures will be made rapidly to protect monitor converters; on abnormal condition, each VBE element responds to the protecting element commands and locks valves or trigs valves continuously.

10. A control and protection system of converter operation test equipment according to claim 9, wherein:

said the system uses independent local controllers, these controllers control high voltage supply system, high direct supply system, current surge circuit, impulse circuit, water cooling system of test equipment and converter sample according to operators commands, and monitors these equipments.

11. A control and protection system of converter operation test equipment according to claim 6 or 9, wherein:

said conditioning element of the control and protecting system fans out signals through DI elements, sends "trigging timing" commands to each VBE element in order to trig corresponding converters of VBE elements on set trigging order; these trigging timing is the trig number and trig phase of converters in each test period or "trigging synchronization" signal period;

because VBE element uses uniform "trigging timing" commands, the trigging timing of each valves can be changed at the same time, and avoids abnormal condition due to different trigging timing.

12. A control and protection system of converter operation test equipment according to claim 10, wherein:

said various elements communicates most data information through "deploy", "interface", "recording wave" and "long distance" four independent CAN buses, the structure and function of four buses are described as below:

the deploy CAN bus is "single master and more minor" form, master injection is human-machine interface element, minor injections include conditioning element, data aggregation element, protecting element, wave form recording element, on-off input element, on-off output element and various VBE elements; deploy CAN bus is used to transmit various human-machine interface information; operators input test parameters through human-machine interface element, these parameters are sent to corresponding function elements through this bus; on the other hand, the analog parameters, on-off parameters information, valve information and various inner events collected by control and protection system is returned to human-machine interface element through this bus for operators query;

interface CAN bus is "more master and more minor" form, it is used to exchange information collected by VBE element and on-off information collected by on-off input element are sent to conditioning element, protecting element and wave form recording element; on the other hand, the conditioning element and protecting element also send action commands to VBE element and on-off output element through interface CAN bus;

recording wave CAN bus is "one master and one minor" form, the master injection is monitor element, the minor injection is wave form recording element; wave recording CAN bus is used to transmit the wave form information of on-off parameters and analog parameters; wave form recording receives on-off information collected by on-off input element and analog parameter acquired results collected by signal acquisition element, and reports wave form monitor element then displays immediately through wave form monitor element;

long distance CAN bus is "single master and more minor" form, master injection is human-machine interface element, the minor injection include high direct current supply system controller, high voltage supply system controller, current surge circuit controller, impulse circuit controller, sample valve water cooling system controller and test equipment water cooling controller; long distance CAN bus reports equipment monitor information collected by various local controllers.

* * * * *